United States Patent [19]

McKenzie et al.

[11] 4,394,587

[45] Jul. 19, 1983

[54] CMOS DIFFERENTIAL COMPARATOR WITH HYSTERESIS

[75] Inventors: James A. McKenzie; Joe W. Peterson, both of Austin, Tex.

[73] Assignee: Motorola, Inc., Schaumburg, Ill.

[21] Appl. No.: 267,975

[22] Filed: May 27, 1981

[51] Int. Cl.³ .............................................. H03K 5/24
[52] U.S. Cl. .................................. 307/355; 307/359; 307/362
[58] Field of Search ................ 307/355, 356, 359, 362

[56] References Cited

U.S. PATENT DOCUMENTS 4,069,431 1/1978 Kucharewski ...................... 307/359
4,110,641 8/1978 Payne ................................. 307/355

OTHER PUBLICATIONS

E. R. Hnatek, Applications of Linear Integrated Circuits, John Wiley and Sons, 1975, pp. 251-255 and 278-279.

Primary Examiner—John Zazworsky
Attorney, Agent, or Firm—Anthony J. Sarli, Jr.; Jeffrey Van Myers; Robert Lee King

[57] ABSTRACT

A hysteresis circuit is added to a differential comparator to provide a predetermined bias current from one of two input transistors connected in a differential configuration. A current mirror structure is used to accurately determine the amount of current which is shunted when the output of the comparator is in a predetermined state.

4 Claims, 2 Drawing Figures

CMOS DIFFERENTIAL COMPARATOR WITH HYSTERESIS

BACKGROUND OF THE INVENTION

1. Field of the Invention

This invention relates generally to differential comparator circuits and more particularly to CMOS differential comparators utilizing hysteresis.

2. Description of the Prior Art

In general, differential comparator circuits exhibit oscillation and noise generation when the output changes from a low-to-high level and from a high-to-low level in response to an input signal slowly crossing the switchpoint voltage of the input devices of the comparator. For TTL comparators, this oscillation occurs at approximately the switchpoint voltage of 1.4 volts. Many such prior art circuits have hysteresis which is the quality of switching from a first state to a second state in response to the magnitude of the input signal crossing one switchpoint and switching from the second state to the first state in response to the magnitude of the input signal crossing a different switchpoint. As noted in *Applications of Linear Integrated Circuits* by Eugene R. Hnatek (John Wiley & Sons, 1975, pages 251-255 and 278-279) hysteresis is obtainable by using an external resistor to couple a predetermined portion of the positive output voltage back to the non-inverting input of an operational amplifier which is configured as a comparator. However, the minimum amount of hysteresis obtainable is limited by the forward gain and output swing of the comparator which is not small enough for many applications. Furthermore, large external resistors are needed to provide a small amount of hysteresis. Other disadvantages with the prior art include the difficulty of implementing the hysteresis circuits in integrated circuit form in a small area and the dependence of the hysteresis voltage on process variations.

SUMMARY OF THE INVENTION

It is an object of the present invention to provide an improved hysteresis circuit in a comparator.

Another object of the present invention is to provide an improved hysteresis circuit fabricated using a standard CMOS process and which generates feedback by utilizing ratioed current mirrors and no resistors.

It is yet a further object of the invention to provide a CMOS differential comparator that exhibits no undefined output states.

In carrying out the above and other objects and advantages of the invention, there is provided, in one form, a comparator having a differential input configuration of two transistors having the gates thereof coupled to a respective one of two input signals. In preferred forms, a bias current transistor is connected to a selected one of the two transistors to shunt a ratioed portion of the current sourced by the selected transistor to a reference such as ground. The ratio of the shunted current is determined by current mirrors. Hysteresis is realized by utilizing feedback via a switch which selectively couples the bias current transistor to the reference in response to the output voltage of the comparator exceeding a predetermined threshold. The above and other objects, features and advantages of the present invention will be more clearly understood from the following detailed description taken in conjunction with the accompanying drawings.

DESCRIPTION OF THE PREFERRED EMBODIMENT

Figure 1:
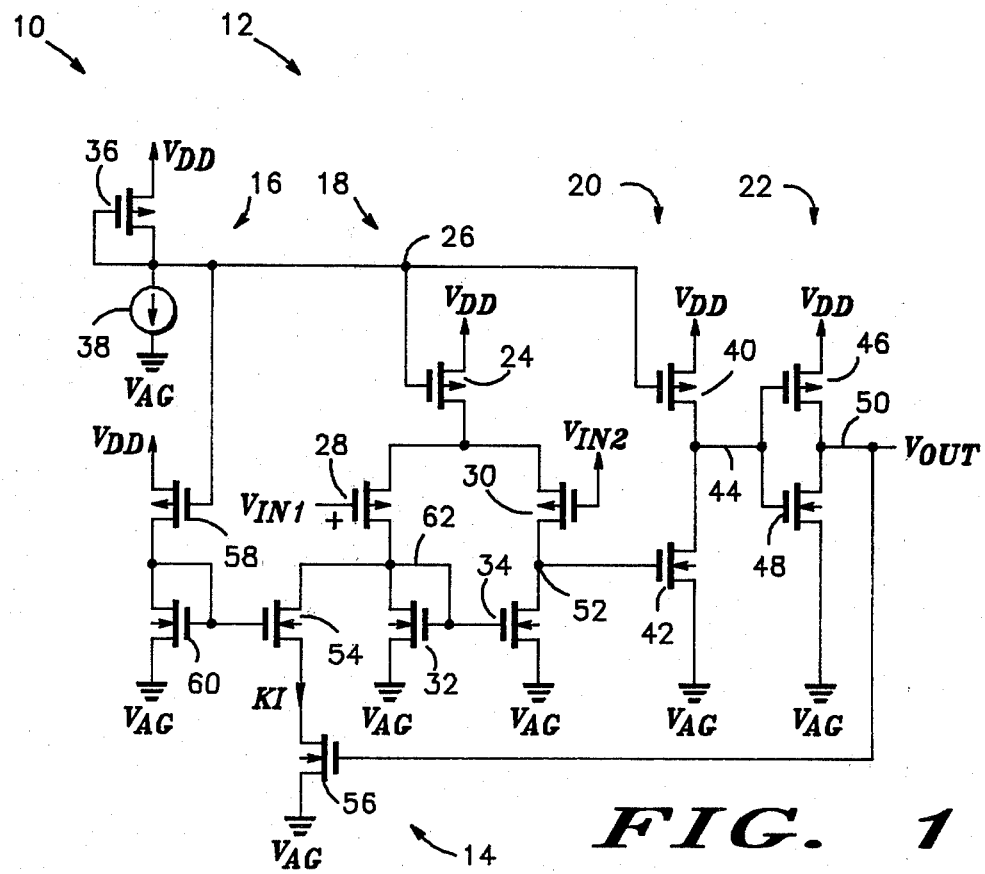
FIG. 1 is a schematic diagram of a preferred embodiment of the invention.

Shown in FIG. 1 is a hysteresis circuit 10 constructed in accordance with a preferred embodiment of this invention. The hysteresis circuit 10 is comprised generally of a comparator portion 12 and a hysteresis portion 14. In the illustrated form the comparator portion 12 comprises a reference voltage generator 16, a differential input stage 18, a gain stage 20 and an output buffer stage 22.

In the differential input stage 18, a current source transistor 24 has the source thereof connected to a supply voltage $V_{DD}$, the gate thereof connected to a reference voltage developed on node 26, and the drain thereof connected to the sources of a differential pair of P-channel MOS transistors 28 and 30 having the gates thereof connected to respective input signals $V_{IN1}$ and $V_{IN2}$. The drains of the transistors 28 and 30 are the differential output nodes of the input stage 18 and are connected to a pair of N-channel load transistors 32 and 34 having the drains thereof coupled to the drains of transistors 28 and 30, respectively, the sources thereof coupled to a supply voltage $V_{AG}$, and the gates thereof coupled to the drain of the transistor 28.

In the reference voltage generator 16, a P-channel MOS transistor 36 has the source thereof connected to the supply voltage $V_{DD}$ and the gate and drain thereof coupled to a constant current sink 38 which is connected to the supply voltage $V_{AG}$. The transistor 36 provides a predetermined voltage which is related to the supply voltage $V_{DD}$ and which biases the current source transistor 24.

In the gain stage 20, a P-channel MOS transistor 40 and an N-channel MOS transistor 42 have the drain thereof connected at node 44. The transistor 40 has the gate thereof connected to the node 26 and the source thereof connected to the supply voltage $V_{DD}$. The transistor 42 has the gate thereof connected to the drain of transistor 30 and the drain of transistor 34, and the source thereof connected to the supply voltage $V_{AG}$.

In the output buffer stage 22, a P-channel MOS transistor 46 and an N-channel MOS transistor 48 have the gates thereof connected to node 44 and the drains thereof connected together at node 50. The transistor 46 has the source thereof connected to the supply voltage $V_{DD}$, and the transistor 48 has the source thereof connected to the supply voltage $V_{AG}$.

In operation, the transistor 36 and the constant current sink 38 generate a reference voltage related to the supply voltage $V_{DD}$. This reference voltage determines the current sourced by the P-channel transistors 24 and 40. The transistor 24 acts as a current source to regulate the current flowing into the sources of the transistors 28 and 30. Similarly, the transistor 40 acts as a current source and is ratioed to the transistor 24 to provide a current which is proportional to the current the transistor 24 provides to the transistors 28 and 30. The equivalent series impedance of the transistor 24, determined in part by the gate length, sets the common mode rejection ratio of the comparator portion 18.

Assume for the purposes of illustration that $V_{IN1}$ has a particular value against which $V_{IN2}$ is to be compared. For example, if $V_{IN1}$ is established at 1.4 volt and $V_{IN2}$ equals $V_{IN1}$, the current flowing through the transistors 28 and 30 is theoretically equal and the output $V_{OUT}$ is indeterminate. On the other hand, when $V_{IN2}$ is greater than 1.4 volt, the gate-to-source voltage ($V_{GS}$) of the transistor 30 decreases as $V_{IN2}$ increases. Simultaneously the voltage potential at node 52 decreases with respect to the supply voltage $V_{AG}$. Therefore, less current flows through the transistor 30 as $V_{IN2}$ increases. The decrease in voltage potential at the node 52 causes the transistor 42 to be only minimally biased or turned on and thus the output voltage of the gain stage 20 increases. As the voltage potential at the node 44 increases, the output voltage, $V_{OUT}$, of the buffer stage 22 decreases.

In contrast, when $V_{IN2}$ is less than 1.4 volt, the gate-to-source voltage of the transistor 30 increases as $V_{IN2}$ decreases. Simultaneously, the voltage potential at the node 52 increases with respect to the supply voltage $V_{AG}$. Therefore, more current flows through the transistor 30 as $V_{IN2}$ decreases. The increase in voltage potential at the node 52 causes the transistor 42 to be strongly biased or turned on and therefore the output voltage at the node 44 decreases. As the voltage potential at the node 44 decreases, the output voltage $V_{OUT}$ of the buffer stage 22 increases and approaches $V_{DD}$.

One of the disadvantages with the comparator portion 12 as described is that for very small differential input voltages, the output voltage cannot swing from $V_{AG}$ to $V_{DD}$ because the transistors 28 and 30 do not have infinite gain. In addition, the circuit 10 may oscillate and have an undefined output state due to parasitic feedback from the output to one of the two inputs. Noise sources as low as a few milivolts may also adversely affect the circuit and generate an incorrect output signal.

As shown in FIG. 1, a hysteresis portion 14 is added to the circuit 10 to provide hysteresis and prevent the output from oscillating when the value of $V_{IN2}$ slowly approaches $V_{IN1}$. The hysteresis portion 14 comprises an N-channel transistor 54 which has the drain thereof connected to the drains of the transistors 28 and 32, the source thereof connected to the drain of an N-channel MOS transistor 56 which has the source thereof connected to the supply voltage $V_{AG}$, and the gate thereof connected to the output voltage, $V_{OUT}$, at the node 50. A bias voltage is provided for the transistor 54 by a P-channel MOS transistor 58 and an N-channel MOS transistor 60 which has the drain and gate thereof connected together and to both the drain of the transistor 58 and the gate of the transistor 54, and the source thereof connected to the supply voltage $V_{AG}$. The transistor 58 has its source connected to the supply voltage $V_{DD}$ and its gate connected to the gate and drain of the transistor 36 at the node 26.

In the preferred embodiment, the transistors 36, 58 and 60 have the size of their gate lengths and widths ratioed to each other to produce a current, KI, through the source of the transistor 54 where K is approximately the product of the ratios of the following transistor gate sizes: $(T_{54}/T_{60}) \times (T_{58}/T_{36})$. By constructing the transistor 58 to have the same ratio of channel width to channel length as the transistor 36 and thus the same current density, the gate-to-source voltage $V_{GS}$ of the transistor 58 will be substantially the same as that of the transistor 36. Thus the gate dimensions of the transistor 36 determines the bias voltage applied to the gate of the transistor 58 and the current which flows through the transistor 58 is a mirrored current from the transistor 36. The current which flows through the transistor 58 is forced through the transistor 60 to develop a gate-to-source voltage which is proportional to the mirrored current and relative to the supply voltage $V_{AG}$. By similarly constructing the transistor 54 to have its channel width and channel length ratioed with the channel width and length of the transistor 60 and therefore have a ratioed current density, the gate-to-source voltage $V_{GS}$ of the transistor 54 will be proportional to the gate-to-source voltage of the transistor 60. The transistor 60 is therefore a master current mirror device and the transistor 54 is a slave device. The $V_{GS}$ of the transistors 54 and 60 will differ by the drain-to-source voltage of the transistor 56 which is negligible since the transistor 56 is being used as a switch and the gate-to-source voltage is therefore approximately equal to the supply voltage $V_{DD}$.

The transistor 56 operates as a switch which is controlled by the output voltage $V_{OUT}$. When $V_{OUT}$ is in a high state, the transistor 56 is biased on, allowing the transistor 54 to shunt the predetermined current, KI, through the transistor 56 to the supply voltage $V_{AG}$. The additional parallel conductance from the node 62 to $V_{AG}$ which is added to the transistor 32 by the transistors 54 and 56, causes the gate-to-source voltage of the transistors 32 and 34 to decrease. However, the gate-to-source voltages of the transistors 28 and 30 remain constant, so the transistors 28 and 30 conduct the same amount of current as when the hysteresis circuit 14 was switched out of the circuit 10. Thus, the reduced gate-to-source voltage of the transistor 34 raises the voltage at the node 52, causing the differential pair to become unbalanced. Before the differential pair will again be balanced, the input voltage $V_{IN2}$ must increase until the decreased gate-to-source potential of the transistor 30 forces a current through the transistor 34 equal to the current through the transistor 32.

Figure 2:
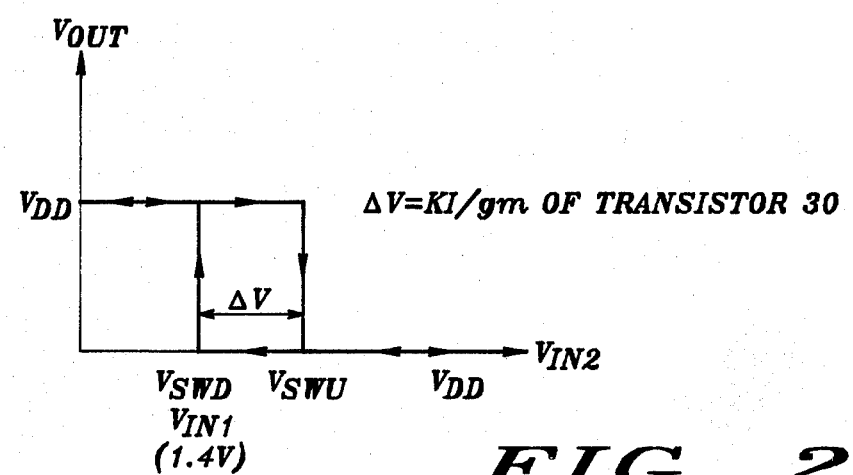
FIG. 2 is a graphic illustration of the voltage transfer characteristic of the invention as shown in FIG. 1.

FIG. 2 illustrates the voltage transfer characteristic of the circuit 10. When $V_{IN2}$ is much greater than $V_{IN1}$, the transistor 30 is not conducting and $V_{OUT}$ is zero or at the supply voltage $V_{AG}$. When $V_{IN2}$ is slowly reduced in value, the downward switchpoint $V_{SWD}$ of the transistor 30 is reached at $V_{IN1}$ or 1.4 volt and the output $V_{OUT}$ goes into a high state to the value of $V_{DD}$ and the hysteresis circuit 14 is switched into the circuit 10. The output remains at $V_{DD}$ for all values of $V_{IN2}$ less than 1.4 volt. In order for the differential input to be balanced again, the transistor 30 will require a smaller $V_{GS}$ or a larger $V_{IN2}$ to balance the nodes 52 and 62 than if the transistor 54 was not conducting the current KI. When $V_{IN2}$ slowly increases, the upward switchpoint $V_{SWU}$ is now $V_{IN1} + \Delta V$ where $\Delta V = (KI)/g_m$ of transistor 30). By selectively switching the hysteresis circuit 14, the $V_{GS}$ of the transistor 30 has been varied to require a different value of $V_{IN2}$ to affect the voltage potential at the node 52.

While the invention has been described in the context of a preferred embodiment, it will be apparent to those skilled in the art that the present invention may be modified in numerous ways and may assme many embodiments other than that specifically set out and described above. Accordingly, it is intended by the appended claims to cover all modifications of the invention which fall within the true spirit and scope of the invention.

We claim:

1. In a comparator for providing an output voltage which is proportional to the difference between a first input voltage on a gate of a first MOS transistor and a second input voltage on a gate of a second MOS transistor coupled to form a differential stage with the first transistor, a hysteresis circuit comprising:

bias current means comprising:

a third MOS transistor having a first current electrode coupled to a selected one of the first and second transistors, a gate electrode, and a second current electrode for shunting a predetermined portion of current sourced by the one transistor in an enabled condition;

a fourth MOS transistor having both a first current electrode and a gate electrode coupled to the gate electrode of said third MOS transistor, wherein said fourth MOS transistor is coupled as a master current mirror device and said third MOS transistor is coupled as a slave current mirror device; and a current source coupled to the first current electrode of said fourth MOS transistor; and switching means coupled to the second current electrode of said third MOS transistor and to an output of the comparator, for enabling the bias current means when the output voltage of the comparator exceeds a predetermined threshold.

2. The comparator circuit of claim 1 wherein the current source is a fifth MOS transistor which is controlled by reference voltage means that provide a reference voltage related to a supply voltage.

3. A hysteresis circuit in combination with a differential amplifier for providing an output voltage which is proportional to the difference between a first input voltage on a gate of a first MOS transistor and a second input voltage on a gate of a second MOS transistor coupled with the first transistor to form a differential stage, comprising:

a third MOS transistor coupled to a selected one of the first and second transistors, for shunting in an enabled condition a predetermined portion of current sourced by the one transistor;

a fourth MOS transistor coupled to said third MOS transistor, wherein said fourth MOS transistor is coupled as a master current mirror device for determining said predetermined portion of current sourced by the one transistor, and said third MOS transistor is coupled as a slave current mirror device;

a current source coupled to said fourth MOS transistor for providing said current; and a fifth MOS transistor coupled to the third MOS transistor and to an output of the comparator, for enabling the third MOS transistor when the output voltage exceeds a predetermined threshold.

4. A CMOS differential comparator with controlled hysteresis comprising:

a CMOS differential amplifier having a first and a second P-channel MOS transistor having the gates thereof connected to respective input voltages, and an output for providing a voltage which is proportional to the difference of the input voltages;

a first N-channel MOS transistor coupled to a selected one of the first and second P-channel MOS transistors for shunting in an enabled condition a predetermined portion of current sourced by the selected transistor;

a second N-channel MOS transistor coupled to the first N-channel MOS transistor and to the output, for enabling the first N-channel MOS transistor when the output voltage exceeds a predetermined threshold;

a third N-channel MOS transistor coupled as a master current mirror device with the first N-channel MOS transistor wherein the first MOS transistor is a slave current mirror device; and a third P-channel MOS transistor coupled to both the third N-channel MOS transistor and a reference voltage terminal, for providing a current source.

* * * * *